(12) United States Patent
Zhu et al.

(10) Patent No.: US 9,185,194 B2
(45) Date of Patent: Nov. 10, 2015

(54) HANDHELD ELECTRONIC DEVICE, SUPPORT ASSEMBLY, AND SUPPORT ASSEMBLY FABRICATING METHOD

(71) Applicant: Huawei Technologies Co., Ltd., Shenzhen, Guangdong (CN)

(72) Inventors: Ailan Zhu, Shenzhen (CN); Mingxing Yang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/465,426

(22) Filed: Aug. 21, 2014

(65) Prior Publication Data

US 2015/0011271 A1 Jan. 8, 2015

Related U.S. Application Data

(63) Continuation of application No. PCT/CN2013/084529, filed on Sep. 27, 2013.

(30) Foreign Application Priority Data

Apr. 9, 2013 (CN) .......................... 2013 1 0120646

(51) Int. Cl.

| H04M 1/00 | (2006.01) |
|---|---|
| H04M 1/02 | (2006.01) |
| C22C 47/00 | (2006.01) |
| B22D 17/14 | (2006.01) |
| B22D 25/06 | (2006.01) |
| B22D 17/00 | (2006.01) |
| B22D 21/02 | (2006.01) |
| H05K 5/00 | (2006.01) |

(52) U.S. Cl.
CPC ........... *H04M 1/0202* (2013.01); *B22D 17/007* (2013.01); *B22D 17/14* (2013.01); *B22D 21/022* (2013.01); *B22D 25/06* (2013.01); *C22C 47/00* (2013.01); *H05K 5/0004* (2013.01); *H04M 1/0266* (2013.01)

(58) Field of Classification Search
USPC ........................................................ 455/575.1
See application file for complete search history.

(56) References Cited

U.S. PATENT DOCUMENTS

2009/0280875 A1* 11/2009 Liang .......................... 455/575.8

FOREIGN PATENT DOCUMENTS

| CN | 101577741 A | 11/2009 |
|---|---|---|
| CN | 102021503 A | 4/2011 |
| CN | 102811264 A | 12/2012 |
| WO | WO 2012162909 A1 | 12/2012 |
| WO | WO 2013048429 A1 | 4/2013 |

* cited by examiner

*Primary Examiner* — Ankur Jain
(74) *Attorney, Agent, or Firm* — Leydig, Voit & Mayer, Ltd.

(57) ABSTRACT

The present invention provides a support assembly mounted between a rear cover and a screen of a handheld electronic device to support and fasten a component of the handheld electronic device. The support assembly includes an appearance part and an internal structure support part, where the appearance part and the internal structure support part are fabricated through integral molding of an amorphous alloy; the internal structure support part is formed by extending the top or the middle of the appearance part inwards; and an average thickness of the internal structure support part is less than 2 mm. The present invention simplifies a process of assembling the handheld electronic device. The present invention further provides a support assembly fabricating method and a handheld electronic device.

16 Claims, 3 Drawing Sheets

HANDHELD ELECTRONIC DEVICE, SUPPORT ASSEMBLY, AND SUPPORT ASSEMBLY FABRICATING METHOD

CROSS-REFERENCE TO RELATED APPLICATIONS

This application is a continuation of International Patent Application No. PCT/CN2013/084529, filed on Sep. 27, 2013, which claims priority to Chinese Patent Application No. 201310120646.9, filed on Apr. 9, 2013, both of which are hereby incorporated by reference in their entireties.

TECHNICAL FIELD

The present invention relates to the field of electronic technologies, and in particular, to a handheld electronic device, a support assembly, and a support assembly fabricating method.

BACKGROUND

Generally, a handheld electronic device, for example, a mobile phone, includes a touch screen assembly, a rear cover, an internal structure support assembly, an appearance part, and so on. Traditional appearance parts and internal structure support assemblies usually are made of high-strength and high-hardness materials like stainless steel or aluminum alloy. Due to the high-strength and high-hardness materials of the appearance part, the appearance part and the internal structure support assembly can be connected only in a screw locking manner or a welding manner. As a result, a mobile phone assembling process is relatively complicated with a high cost.

SUMMARY

The technical issue to be solved by embodiments of the present invention is to provide a handheld electronic device, a support assembly, and a support assembly fabricating method, so as to simplify a mobile phone assembling process.

To solve the foregoing technical issue, the present invention provides a support assembly mounted between a rear cover and a screen of a handheld electronic device to support and fasten a component of the handheld electronic device, where the support assembly includes an appearance part and an internal structure support part, where the appearance part and the internal structure support part are fabricated through integral molding of an amorphous alloy; the internal structure support part is formed by extending the top or the middle of the appearance part inwards; and an average thickness of the internal structure support part is less than 2 mm.

The present invention further provides a support assembly fabricating method, including:

providing a vacuum die-casting mold;

heating and melting an amorphous alloy under a vacuum environment to cause a material temperature of the amorphous alloy to be higher than a preset temperature range of the melting point of the amorphous alloy;

injecting the melted amorphous alloy into a charging barrel of a compressor, and accelerating the rate of pressurization to inject the melted amorphous alloy into the vacuum die-casting mold; and performing thermal insulation on the vacuum die-casting mold for a preset time to obtain the support assembly, where the support assembly includes an appearance part and an internal structure support part that undergoes one-time near net shape forming with the appearance part.

The present invention further provides a handheld electronic device, including a rear cover, a component, and a support assembly, where the support assembly is mounted between the rear cover and the screen to support and fasten the component; the support assembly includes an appearance part and an internal structure support part, where the appearance part and the internal structure support part are fabricated through integral molding of an amorphous alloy; the internal structure support part is formed by extending the top or the middle of the appearance part inwards; and an average thickness of the internal structure support part is less than 2 mm.

By implementing the embodiments of the present invention, the following benefits can be obtained:

By implementing the embodiments of the present invention, the appearance part and the internal structure support part are fabricated through integral molding of an amorphous alloy. The internal structure support part is formed by extending the top or the middle of the appearance part inwards, and the average thickness of the internal structure support part is less than 2 mm. The appearance part 41 and the internal structure support assembly of the present invention do not need to be connected in a screw locking manner or welding manner, thereby simplifying a process of assembling the handheld electronic device 100.

BRIEF DESCRIPTION OF DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

Figure 1:
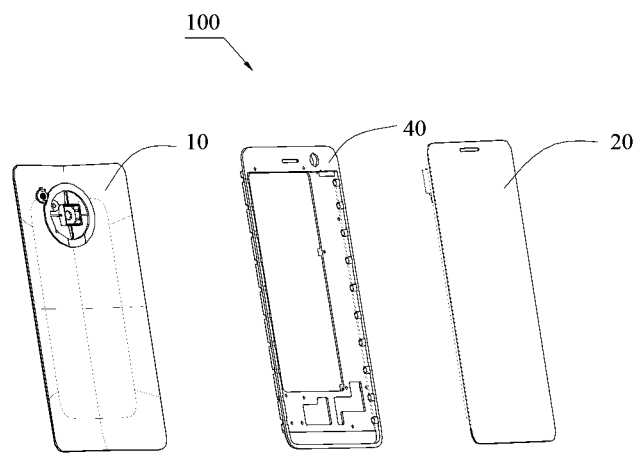
FIG. 1 is a schematic decomposition diagram of a mobile electronic device according to a preferred implementation manner of the present invention.

FIG. 1 shows a handheld electronic device 100 according to a preferred embodiment of the present invention. The handheld electronic device 100 includes a rear cover 10, a screen 20, a component (not shown), and a support assembly 40.

Figure 2:
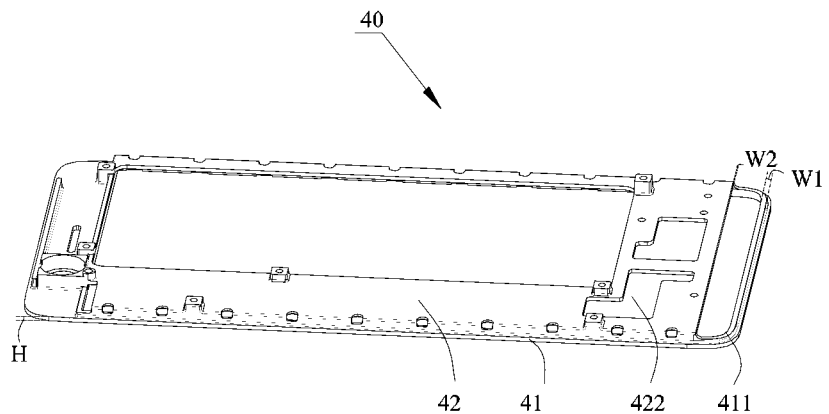
FIG. 2 is a schematic diagram of a support assembly in FIG. 1.

Referring to FIG. 2, the support assembly 40 is mounted between the rear cover 10 and the screen 20 to support and fasten the component. The support assembly 40 includes an appearance part 41 and an internal structure support part 42. The appearance part 41 and the internal structure support part 42 are fabricated through integral molding of an amorphous alloy. The internal structure support part 42 is formed by extending the top or the middle of the appearance part 41 inwards. An average thickness of the internal structure support part 42 is less than 2 mm.

Specifically, a height H of the appearance part 41 ranges from 0.5 mm to 10 mm. A wall thickness W1 of the appearance part 41 ranges from 0.5 mm to 3 mm. A thickness W2 of a support area of the internal structure support part 42 ranges from 0.2 mm to 2 mm. The appearance part 41 and the internal structure support part 42 undergo one-time near net shape forming by using a zirconium-based amorphous alloy die-casting or semi-solid forming process.

A through-slot 422 is disposed on the internal structure support part 42 and is configured to contain the component disposed on the internal structure support part 42.

An external surface of the appearance part 41 shows a metal texture after undergoing highlight polishing or sand blasting and brushing processing.

In this implementation manner, the amorphous alloy is a zirconium-based amorphous alloy. In other implementation manners, the amorphous alloy may be adjusted according to an actual need, but the adjusted material must also be an amorphous alloy. This is because, only by using an amorphous alloy, can a support assembly with an internal component less than 2 mm be molded in an integral molding manner to meet requirements of an ultra thin handheld electronic device and a high-strength support assembly.

In this preferred implementation manner, the appearance part 41 and the internal structure support part 42 are fabricated through integral molding of an amorphous alloy. The internal structure support part is formed by extending the top or the middle of the appearance part inwards, and the average thickness of the internal structure support part is less than 2 mm. The appearance part 41 and the internal structure support assembly of the present invention do not need to be connected in a screw locking manner or welding manner, thereby simplifying a process of assembling the handheld electronic device 100.

Referring to FIG. 2, which is a flowchart of a support assembly fabricating method according to a first preferred implementation manner of the present invention, the method may include the following steps:

Step 101. Providing a vacuum die-casting mold.

The vacuum die-casting mold is designed according to the specific dimension of the support assembly. Therefore, the vacuum die-casting mold may be designed according to a user requirement, and the molded support assembly that has undergone die-casting by the vacuum die-casting mold fully complies with the designed dimension of the user.

Step 102. Heating and melting an amorphous alloy under a vacuum environment to cause a material temperature of the amorphous alloy to be higher than a preset temperature range of the melting point of the amorphous alloy.

In this implementation manner, a vacuum degree of the vacuum environment is greater than 500 Pascals. The preset temperature range is 50 degrees Celsius to 300 degrees Celsius. The amorphous alloy is a zirconium-based amorphous alloy. In other implementation manners, the vacuum degree of the vacuum environment and the preset temperature range may be adjusted according to actual needs. The amorphous alloy may be adjusted according to an actual need, but the adjusted material must also be an amorphous alloy. This is because, only by using an amorphous alloy, can a support assembly with an internal component less than 2 mm be molded in an integral molding manner to meet requirements of an ultra thin handheld electronic device and a high-strength support assembly.

Step 103: Injecting the melted amorphous alloy into a charging barrel of a compressor, and accelerating the rate of pressurization to inject the melted amorphous alloy into the vacuum die-casting mold.

Step 104. Performing thermal insulation on the vacuum die-casting mold for a preset time to obtain the support assembly, where the support assembly includes an appearance part and an internal structure support part that undergoes one-time near net shape forming with the appearance part.

In this preferred implementation manner, the support assembly 100 is obtained by using the support assembly fabricating method. The appearance part 41 and the internal structure support part 42 of the support assembly 100 are fabricated through integral molding of an amorphous alloy. The internal structure support part 42 is formed by extending the top or the middle of the appearance part 41 inwards. An average thickness of the internal structure support part 42 is less than 2 mm. The appearance part 41 and the internal structure support assembly 42 of the present invention do not need to be connected in a screw locking manner or welding manner, thereby simplifying a process of assembling the handheld electronic device 100.

Figure 3:
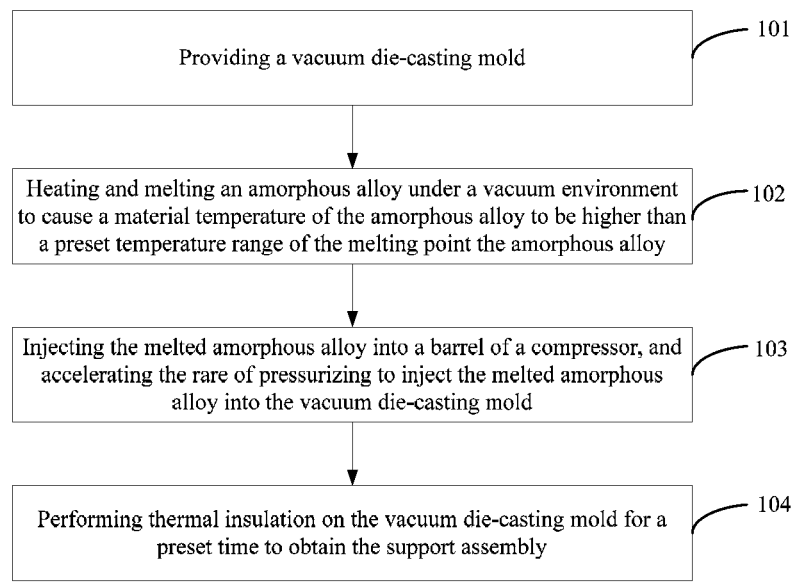
FIG. 3 is a flowchart of a support assembly according to a first preferred implementation manner of the present invention.
Figure 4:
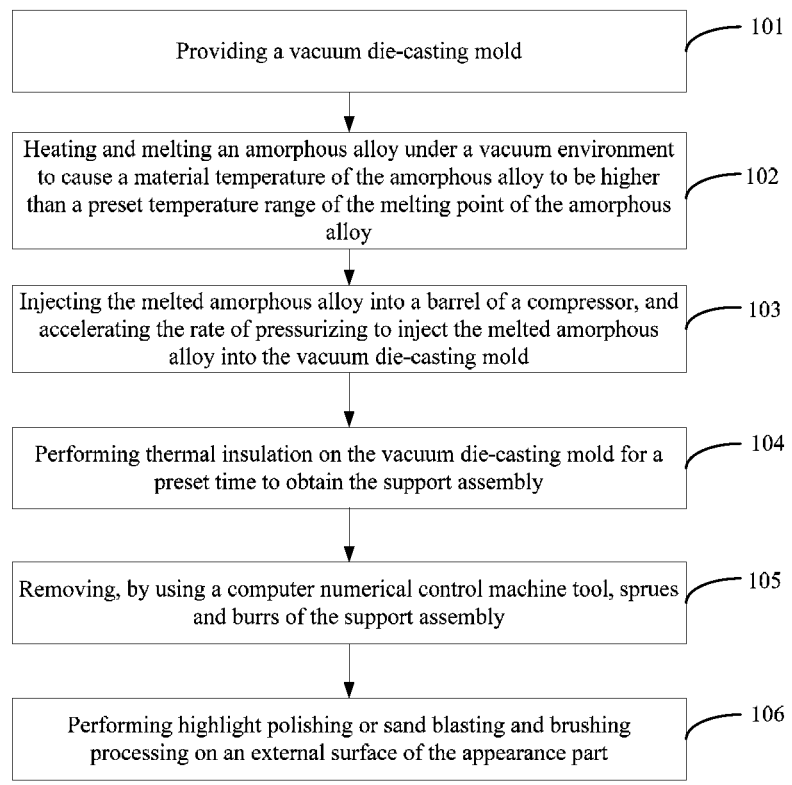
FIG. 4 is a flowchart of a support assembly according to a second preferred implementation manner of the present invention.

Referring to FIG. 3, a second preferred implementation manner of the present invention provides a support assembly fabricating method. The support assembly fabricating method provided in the second preferred implementation manner is similar to the support assembly fabricating method provided in the first preferred implementation manner, with a difference in that, in the second preferred implementation manner, the support assembly fabricating method further includes:

Step 105: Removing, by using a computer numerical control machine tool, sprues and burrs of the support assembly.

Step 106: Performing highlight polishing or sand blasting and brushing processing on an external surface of the appearance part, so that the external surface of the appearance part shows a metal texture.

In this preferred implementation manner, the support assembly 100 is obtained by using the support assembly fabricating method. In this preferred implementation manner, the support assembly 100 is obtained by using the support assembly fabricating method. The appearance part 41 and the internal structure support part 42 of the support assembly 100 are fabricated through integral molding of an amorphous alloy. The internal structure support part 42 is formed by extending the top or the middle of the appearance part 41 inwards. An average thickness of the internal structure support part 41 is less than 2 mm. The appearance part 41 and the internal structure support assembly 42 of the present invention do not need to be connected in a screw locking manner or welding manner, thereby simplifying a process of assembling the handheld electronic device 100.

What is disclosed above is merely an exemplary embodiment of the present invention, and definitely cannot be used to limit the protection scope of the present invention. A person skilled in the art can understand all or a part of processes that implement the foregoing embodiments and equivalent variations made in accordance with the claims of the present invention shall fall within the scope of the present invention.

What is claimed is:

1. A support assembly, mounted between a rear cover and a screen of a handheld electronic device to support and fasten a component of the handheld electronic device, wherein the support assembly comprises an appearance part and an internal structure support part, wherein the appearance part and the internal structure support part are fabricated through integral molding of an amorphous alloy; the internal structure support part is formed by extending a top section or a middle section of the appearance part inwards; and an average thickness of the internal structure support part is less than 2 mm.

2. The support assembly according to claim 1, wherein a height of the appearance part ranges from 0.5 mm to 10 mm.

3. The support assembly according to claim 1, wherein the appearance part and the internal structure support part undergo one-time near net shape forming using a zirconium-based amorphous alloy die-casting or semi-solid forming process.

4. The support assembly according to claim 1, wherein a through-slot is disposed on the internal structure support part to contain a component disposed on the internal structure support part.

5. The support assembly according to claim 1, wherein an external surface of the appearance part shows a mental texture after undergoing highlight polishing or sand blasting and brushing processing.

6. The support assembly according to claim 1, wherein the amorphous alloy is a zirconium-based amorphous alloy.

7. The support assembly according to claim 1, wherein a wall thickness of the appearance part ranges from 0.5 mm to 3 mm.

8. The support assembly according to claim 1, wherein a thickness of the internal structure support part ranges from 0.2 mm to 2 mm.

9. A handheld electronic device, comprising a rear cover, a component, and a support assembly, wherein the support assembly is mounted between the rear cover and the screen to support and fasten the component, the support assembly comprises an appearance part and an internal structure support part, wherein the appearance part and the internal structure support part are fabricated through integral molding of an amorphous alloy; the internal structure support part is formed by extending a top section or a middle section of the appearance part inwards; and an average thickness of the internal structure support part is less than 2 mm.

10. The handheld electronic device according to claim 9, wherein a height of the appearance part ranges from 0.5 mm to 10 mm.

11. The handheld electronic device according to claim 9, wherein a wall thickness of the appearance part ranges from 0.5 mm to 3 mm.

12. The handheld electronic device according to claim 9, wherein a thickness of the internal structure support part ranges from 0.2 mm to 2 mm.

13. The handheld electronic device according to claim 9, wherein the appearance part and the internal structure support part undergo one-time near net shape forming by using a zirconium-based amorphous alloy die-casting or semi-solid forming process.

14. The handheld electronic device according to claim 9, wherein a through-slot is disposed on the internal structure support part to contain a component disposed on the internal structure support part.

15. The handheld electronic device according to claim 9, wherein an external surface of the appearance part shows a mental texture after undergoing highlight polishing or sand blasting and brushing processing.

16. The handheld electronic device according to claim 9, wherein the amorphous alloy is a zirconium-based amorphous alloy.

\* \* \* \* \*